(12) United States Patent
Koizumi et al.

(10) Patent No.: US 10,488,226 B2
(45) Date of Patent: Nov. 26, 2019

(54) PROXIMITY SENSOR

(71) Applicant: OMRON Corporation, Kyoto (JP)

(72) Inventors: Masayuki Koizumi, Nara (JP); Minami Wazumi, Nara (JP); Chunmei Huang, Kodaira (JP); Kenji Homma, Joyo (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/751,156

(22) PCT Filed: Jan. 6, 2017

(86) PCT No.: PCT/JP2017/000291
§ 371 (c)(1),
(2) Date: Feb. 7, 2018

(87) PCT Pub. No.: WO2017/126341
PCT Pub. Date: Jul. 27, 2017

(65) Prior Publication Data
US 2018/0231398 A1    Aug. 16, 2018

(30) Foreign Application Priority Data
Jan. 20, 2016 (JP) ................................ 2016-008365

(51) Int. Cl.
*G01D 5/22* (2006.01)

(52) U.S. Cl.
CPC .................................. *G01D 5/2208* (2013.01)

(58) Field of Classification Search
CPC .. G01D 5/00; G01D 5/12; G01D 5/14; G01D 5/20; G01D 5/22; G01D 5/2208;
(Continued)

(56) References Cited

U.S. PATENT DOCUMENTS 5,006,798 A * 4/1991 Matsuki .............. F16C 29/0657
                                                           324/207.17
2002/0036496 A1    3/2002 Sakata et al.
(Continued)

FOREIGN PATENT DOCUMENTS

| CN | 1739031 | 2/2006 |
|---|---|---|
| CN | 101419050 | 4/2009 |

(Continued)

OTHER PUBLICATIONS

"Office Action of Japan Counterpart Application," dated Sep. 18, 2018, with English translation thereof, pp. 1-6.
(Continued)

*Primary Examiner* — Hoai-An D. Nguyen
(74) *Attorney, Agent, or Firm* — JCIPRNET

(57) ABSTRACT

A proximity sensor is provided with coils (11, 12) disposed in a pre-set positional relationship, a first distance calculation unit (31) and a second distance calculation unit (32) for calculating first distance information (d1) and second distance information (d2), respectively, from the coils (11, 12) to a detection object (W) on the basis of reception results (voltages V1, V2) of the coils (11, 12), and a position estimating unit (33) for estimating the position, such as distance and azimuth, of the detection object (W) on the basis of the first distance information (d1), the second distance information (d2), and the positional relationship of the coils (11, 12).

4 Claims, 11 Drawing Sheets

(58) Field of Classification Search
CPC ........ G01D 5/2225; G01B 7/00; G01B 7/003; G01B 7/004; G01B 7/02; G01B 7/023
USPC .... 324/200, 207.11, 207.13, 207.15, 207.16, 324/207.18
See application file for complete search history.

(56) References Cited

U.S. PATENT DOCUMENTS

| | | | | |
|---|---|---|---|---|
| 2003/0173952 | A1* | 9/2003 | Niwa | G01D 3/036 324/207.16 |
| 2005/0104578 | A1* | 5/2005 | Weber | G01D 5/2013 324/207.15 |
| 2007/0152659 | A1* | 7/2007 | Gurich | F02M 59/44 324/207.24 |
| 2008/0186018 | A1 | 8/2008 | Anderson | |
| 2009/0072820 | A1 | 3/2009 | Grommer et al. | |
| 2011/0181302 | A1* | 7/2011 | Shao | G01D 5/2225 324/654 |
| 2015/0300843 | A1* | 10/2015 | Hunter | G01D 5/20 324/207.15 |

FOREIGN PATENT DOCUMENTS

| | | |
|---|---|---|
| CN | 101788259 | 7/2010 |
| CN | 103673856 | 3/2014 |
| EP | 2284478 | 2/2011 |
| EP | 2366972 | 9/2011 |
| EP | 2792995 | 10/2014 |
| JP | H05-079805 | 3/1993 |
| JP | H07-029466 | 1/1995 |
| JP | H11304405 | 11/1999 |
| JP | 2003-275164 | 9/2003 |
| JP | 2008-002202 | 1/2008 |
| JP | 2012-185033 | 9/2012 |
| JP | 2014-086954 | 5/2014 |
| WO | 2014023595 | 2/2014 |

OTHER PUBLICATIONS

"International Search Report (Form PCT/ISA/210) of PCT/JP2017/000291," dated Apr. 4, 2017, with English translation thereof, pp. 1-4.
"Written Opinion of the International Searching Authority (Form PCT/ISA/237) of PCT/JP2017/000291," dated Apr. 4, 2017, with English translation thereof, pp. 1-10.
"Office Action of China Counterpart Application," dated Jul. 2, 2019, with English translation thereof, pp. 1-14.
"Search Report of Europe Counterpart Application", dated Jul. 5, 2019, pp. 1-9.

* cited by examiner

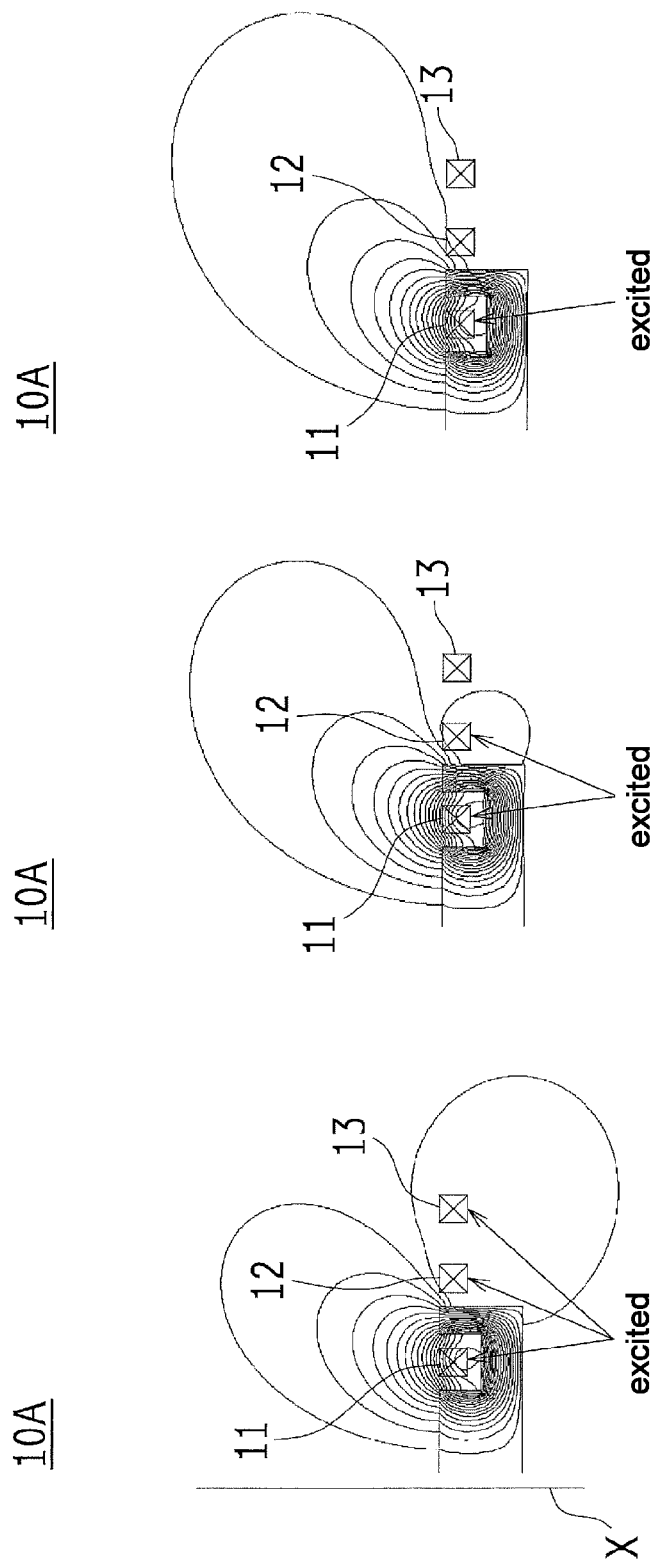

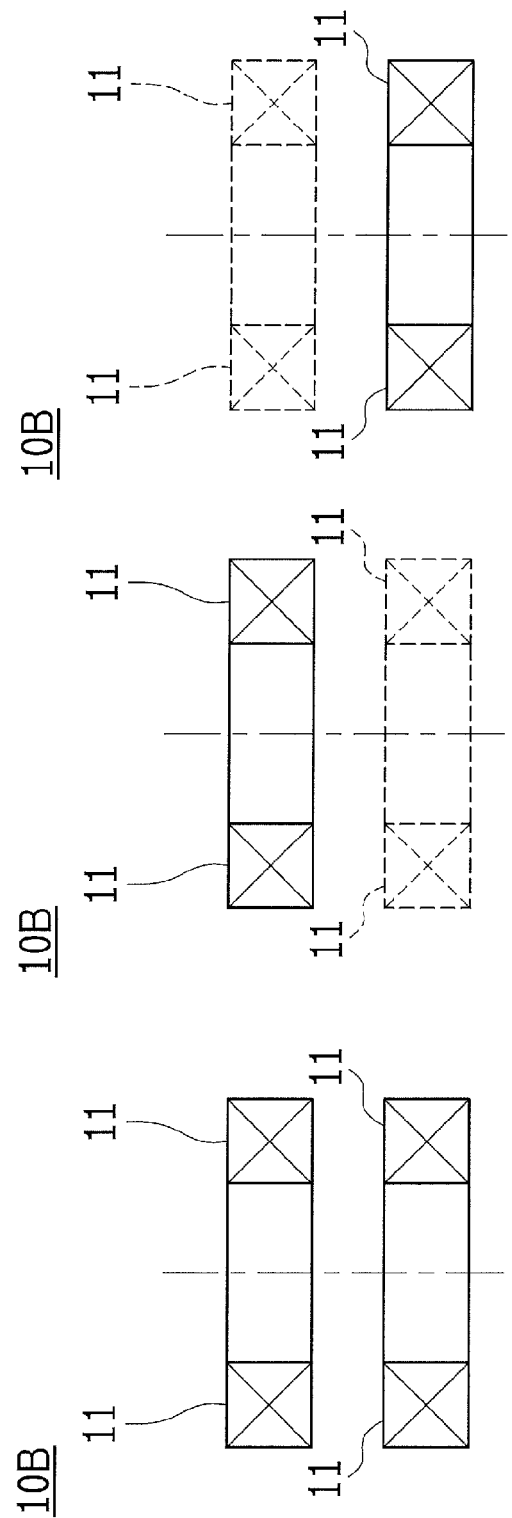

PROXIMITY SENSOR

CROSS-REFERENCE TO RELATED APPLICATION

This application is a 371 application of international application of PCT application serial no. PCT/JP2017/000291, filed on Jan. 6, 2017, which claims the priority benefit of Japan application no. 2016-008365, filed on Jan. 20, 2016. The entirety of each of the abovementioned patent applications is hereby incorporated by reference herein and made a part of this specification.

TECHNICAL FIELD

The present invention relates to a proximity sensor (also referred to as a proximity switch) which determines an approach of (distance to) a metal object by the action of an alternating current (AC) magnetic field, and more particularly to a proximity sensor which can detect a position including not only a distance but also a bearing (direction).

BACKGROUND ART

Conventionally, a proximity sensor, a proximity switch, or the like for determining an approach (whether or not within a predetermined distance) of a metal object by the action of an alternating current (AC) magnetic field has been proposed (see Patent Literature 1 to 3, for example).

In a proximity sensor disclosed in Patent Literature 1, two detection coils (sometimes referred to as a reception coil or a search coil) are provided inside a metallic case and perform detection of a position of nonmagnetic metal, magnetic material, or the like. A proximity sensor with high signal to noise (S/N) ratio and high sensitivity can be realized by directly detecting a value of a current difference rather than applying rectangular wave voltages to two detection coils and respectively detecting a current flowing through each of the detection coils for calculating a difference therebetween using a differential circuit or the like. In addition, since respective detection coils have the same magnetic characteristics and electrical characteristics, even when these characteristics change due to temperature change, they change in the same manner respectively, and thus variations due to temperature change cannot easily occur.

For example, in a third embodiment illustrated in FIGS. 10 to 13 of Patent Literature 1, a detection coil L1006 and a reference coil L1008 are accommodated in a cylindrical case 1001a made of austenite-based stainless steel in a state of facing each other, and a logical value indicating whether or not nonmagnetic metal or magnetic metal has approached to within a predetermined distance can be obtained. In other words, the position detection in Patent Literature 1 merely obtains a one-dimensional distance at most.

In a proximity switch disclosed in Patent Literature 2, a nonmagnetic metal body is used as a case 1. Inside the case 1, a detection coil 3 is provided on a detection surface side, and an excitation coil 2 and a detection coil 4 are provided therebehind. The excitation coil 2 is driven at low frequency, and the detection coils 3 and 4 are connected in series in a direction in which induced voltages when an object is not approaching are canceled out each other. Then, the voltage difference is detected by a differential amplification circuit, and magnetic metal is detected by an increase in differential amplification output which is based on the approach of the magnetic metal.

Also in Patent Literature 2, merely a one-dimensional distance to the magnetic is obtained at most.

Also in a non-contact detection device disclosed in Patent Literature 3, two detection coils L1 and L2 are provided. While the first detection coil L1 detects a detection object, the second detection coil L2 is provided for compensating for external electromagnetic waves, and thereby an influence due to the detection object is prevented. That is, two detection coils L1 and L2 are not used together for detecting the detection object.

CITATION LIST

Patent Literature

[Patent Literature 1]
Japanese Unexamined Patent Application Publication No. 2012-185033
[Patent Literature 2]
Japanese Unexamined Patent Application Publication No. H07-029466
[Patent Literature 3]
Japanese Unexamined Patent Application Publication No. 2014-086954

SUMMARY OF INVENTION

Technical Problem

For example, in a proximity sensor in which a detection coil also serves as an excitation coil, an eddy current is generated in a detection object made of a metal within a detection range due to a magnetic field generated by a current flowing through the detection coil. It is possible to detect proximity of a detection object by detecting a voltage generated in the detection coil by an eddy current magnetic field generated around the eddy current, in other words, by detecting a voltage of the detection coil caused by reflection from the detection object.

FIG. 12 is a schematic cross-sectional view for describing a principle of detecting a position of a detection object W by one detection coil 11 in a conventional proximity sensor.

A voltage V1 of the coil 11 due to reflection from the detection object W is a scalar quantity corresponding to a distance from the detection object W to the coil 11, and when distances at which the voltage V1 is constant are connected, a closed curve (for example, a somewhat flattened circular curve) L1 surrounding the coil 11 is obtained as illustrated in FIG. 12. Further, this curve L1 is actually a rotational curved surface having a central axis of the coil 11 as a rotation axis.

The voltage V1 of the coil 11 does not change, for example, irrespective of whether it is in front of the coil 11 or to the side thereof, as long as the detection object W is on the curve L1. In other words, when the position of the detection object W is detected only on the basis of the voltage V1, only the distance to the detection object W can be detected, and a bearing thereof cannot be detected.

The present invention has been made in view of the above problems of conventional technologies, and it is an object of the present invention to provide a proximity sensor capable of detecting not only a distance to a detection object but also a position including a bearing thereof.

Solution to Problem

In order to achieve the above-described objects, the proximity sensor of the present invention includes two or more coils disposed in a predetermined positional relationship, a distance calculation unit which calculates respective pieces of distance information from the coils which obtain a reception result to a detection object on the basis of the reception results of a plurality of coils from among the coils, and a position estimating unit which estimates a position of the detection object on the basis of each piece of distance information and the positional relationship.

For example, when there are three or more coils, the distance calculation unit may calculate each piece of distance information for the detection object on the basis of the reception results of two coils among them.

Also in the proximity sensor of the present invention, each of the coils may be selectively excited in two or more different combinations, the distance calculation unit may calculate respective pieces of distance information from the plurality of coils to the detection object for each selective excitation of each of the coils, and the position estimating unit may estimate the position of the detection object on the basis of the positional relationship and each piece of distance information calculated for each of the selective excitations.

Each of the coils may be coaxially disposed or may be disposed on the same plane. Alternatively, they may be coaxially disposed on the same plane.

According to the proximity sensor having such a configuration, not only the distance to the detection object but also the position including the bearing can be detected.

Advantageous Effects of Invention

According to the proximity sensor of the present invention, not only the distance to the detection object but also the position including a bearing thereof can be detected.

BRIEF DESCRIPTION OF DRAWINGS

FIGS. 3(a) to 3(c) are schematic cross-sectional views illustrating respective magnetic fields in a case in which a coil unit 10A, as a first modified example of the coil unit 10, having three coils 11 to 13 is excited in three different patterns.

FIGS. 8(a) to 8(c) are schematic cross-sectional views respectively illustrating specific excitation patterns of the coil unit 10B.

Hereinafter, preferred embodiments of the present invention will be described with reference to the drawings.

(1) Principle of Detecting Position by Proximity Sensor

Figure 1:
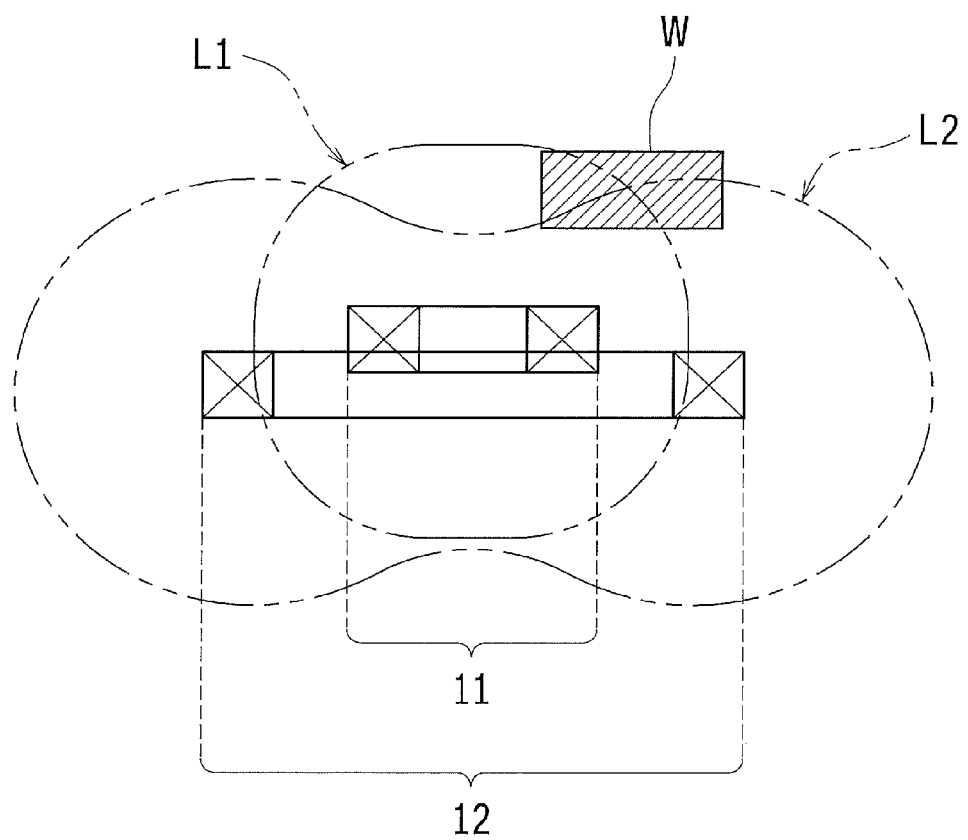
FIG. 1 is a schematic cross-sectional view for describing a principle of detecting a position of a detection object W by a coil unit 10 of a proximity sensor according to one embodiment of the present invention.

FIG. 1 is a schematic cross-sectional view for describing a principle of detecting a position of a detection object W by a coil unit 10 of a proximity sensor according to one embodiment of the present invention.

As illustrated in FIG. 1, the proximity sensor includes a coil unit 10 having a circular coil 11 and a circular coil 12 which has a larger diameter disposed coaxially with the coil 11. Although respective cross sections of the coils 11 and 12 are illustrated with disposition planes slightly shifted from each other, they are actually disposed on the same plane. However, the present invention is not limited to disposition on the same plane.

Figure 12:
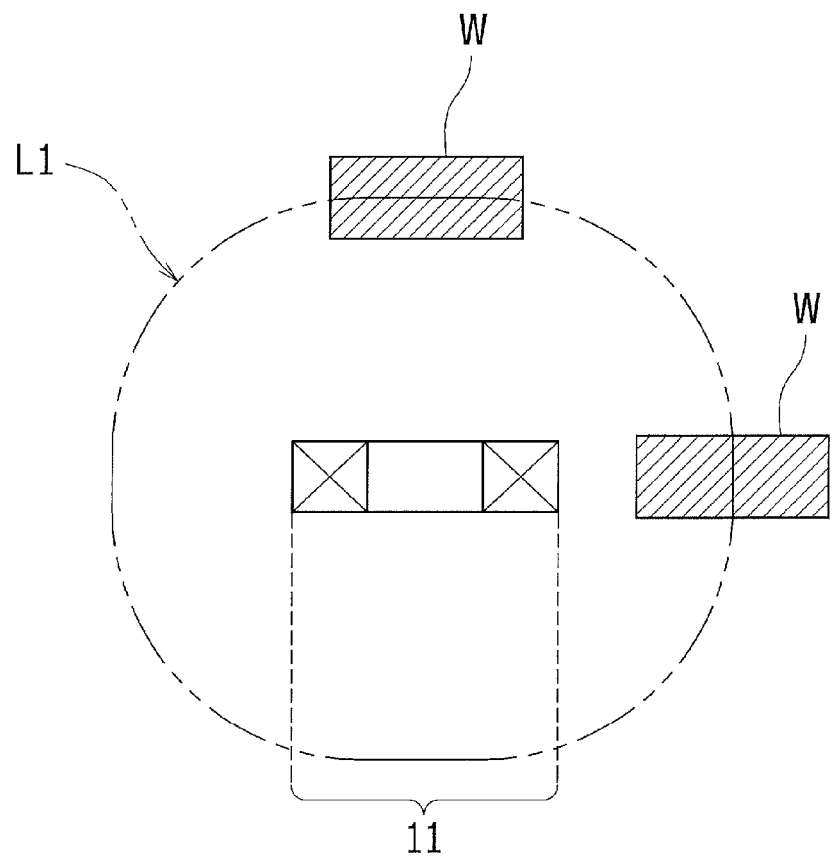
FIG. 12 is a schematic cross-sectional view for describing a principle of detecting a position of a detection object W by one detection coil in a conventional proximity sensor.

As in a conventional proximity sensor described with reference to FIG. 12, since a distance to the detection object W can be detected using a voltage V1 of the coil 11 due to reflection from the detection object W, when distances at which the voltage V1 is constant are connected, a closed curve L1 surrounding the coil 11 (for example, a somewhat flattened circular curve) is obtained. Although a distance to the detection object W can be detected using a voltage V2 of the coil 12 due to reflection from the detection object W, when distances at which the voltage V2 is constant are connected, a closed curve L2 surrounding the coil 12 (for example, a curve having a shape resembling a laterally long peanut) is obtained. Not only the curve L1 but also the curve L2 are actually rotational curved surfaces respectively having central axes of the coils 11 and 12 as rotation axes.

Since the detection object W is on the curve L1 and also on the curve L2, the detection object W exists on an intersection point of the curves L1 and L2. That is, if a positional relationship between the coils 11 and 12 is known, it is possible to detect not only the distance to the detection object W but also the position including a bearing thereof. However, the position in a three-dimensional space may not necessarily be able to be identified. Similarly to the two intersection points present in the drawing, in practice, it can only be assumed that it is on a circumference which is coaxial with the coils 11 and 12 and passing through these intersection points.

However, for example, if a movement direction of the detection object W is restricted to being on a predetermined straight line, it is also possible to identify the position of the detection object W in the three-dimensional space as the intersection point with the straight line.

When the position including the bearing and the position in the three-dimensional space can be identified, for a proximity sensor, for example, it is possible to perform output (detection operation) only for a metal object present in a direction of the central axis of the coil and not to perform output (detection operation) for a metal object present in a radial direction of the coil. That is, a metal object present in the direction of the central axis of the coil is detected as a detection object, and a metal object present in the radial direction of the coil can be ignored as a mounting jig of the sensor or the like. Thereby, it is possible to avoid a change in output (detection operation) of the sensor depending on whether or not a metal mounting jig is used in fixing the proximity sensor. Thus, convenience of mounting the proximity sensor can be improved.

(2) Excitation Pattern of Coil Unit 10 of Proximity Sensor

FIGS. 2(a) to 2(d) are schematic cross-sectional views illustrating respective positional relationships between a magnetic field and the detection object W when the coil unit 10 of the proximity sensor is excited in two different patterns. The left end of each figure corresponds to a position of the central axis of the coils 11 and 12 (illustration of the central axis itself is omitted), and only the right half of the coils 11 and 12 are illustrated. Also, the excitation pattern (also simply referred to as a pattern) may refer to, for example, a combination of excited coils, a combination of directions of currents excited (each coil has a clockwise current and a counterclockwise current), a combination of magnitudes of excitation currents (a magnitude of the current of each coil may be changed in several steps), or the like, but it is not limited thereto.

In the principle of detecting a position by the proximity sensor illustrated in FIG. 1, in the simplest manner, the coils 11 and 12 of the coil unit 10 are respectively excited, and the voltages V1 and V2 of the coils 11 and 12 are respectively obtained. The present invention is not limited to such an excitation pattern, and, for example, as illustrated in FIGS. 2(a) to 2(d), the voltages V1 and V2 of the coils 11 and 12 may be respectively obtained by forming excitation spaces with different patterns such as a case in which both the coils 11 and 12 are simultaneously excited (FIGS. 2(a) and 2(c)) and a case in which only the inner coil 11 is excited (FIGS. 2(b) and 2(d)).

Figure 2A:
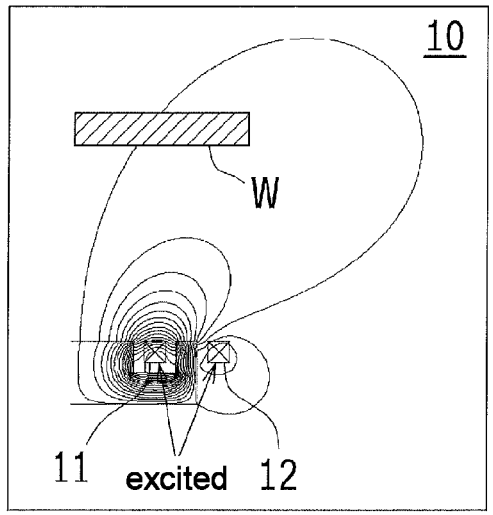
FIGS. 2(a) to 2(d) are schematic cross-sectional views illustrating each positional relationship between a magnetic field and the detection object W when the coil unit 10 of the proximity sensor is excited in two different patterns.
Figure 2B:
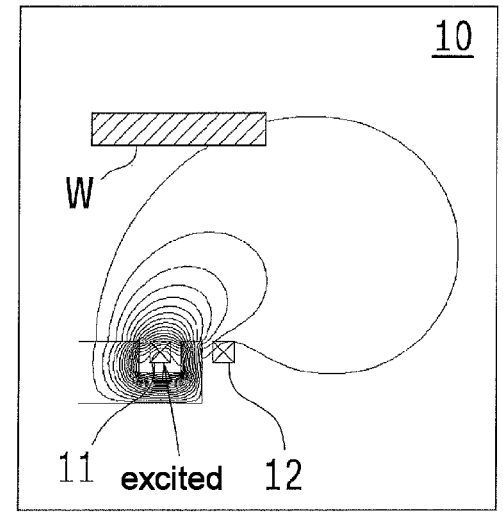
Figure 2C:
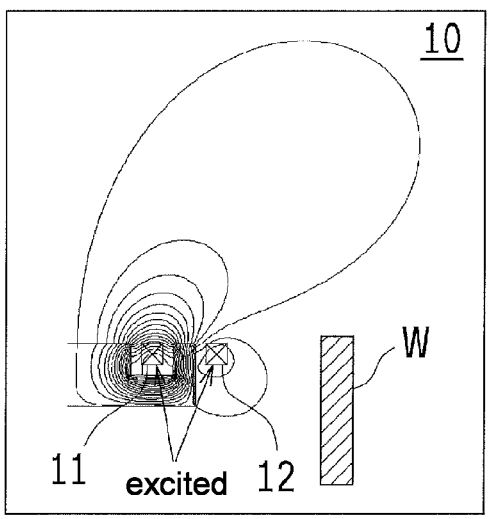
Figure 2D:
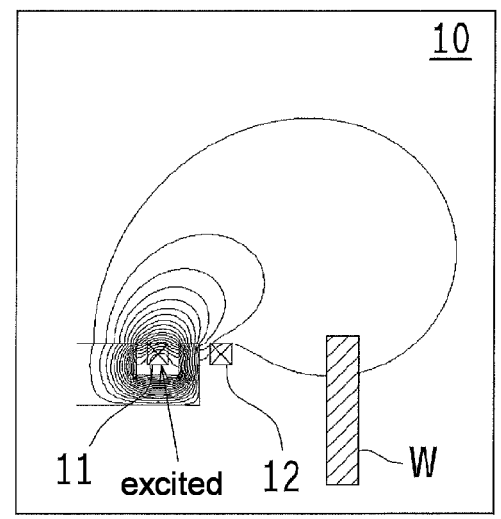

FIGS. 2(b) and 2(d) illustrate excitation states in which only the coil 11 is excited. When FIG. 2(b) and FIG. 2(d) are compared, although positions of the detection objects W in the figure are different, since magnitudes of the magnetic field interlinked with the detection objects W are approximately the same, the voltage V1 generated in the coil 11 due to reflection is approximately the same in the case of FIG. 2(b) and in the case of FIG. 2(d). Next, FIGS. 2(a) and 2(c) illustrate excitation states in which the coil 11 and the coil 12 are excited with currents in opposite directions to each other. When FIG. 2(a) (upper left) and FIG. 2(c) are compared, since magnitudes of the interlinked magnetic field depending on the position of the detection object W are different, the voltage V1 generated in the coil 11 due to reflection is different between the case of FIG. 2(a) and the case of FIG. 2(b).

FIGS. 2(a) and 2(b) detect the detection object W in a central axis direction of the coil. When FIGS. 2(a) and 2(b) are compared, V1 in FIG. 2(a) is higher than that in FIG. 2(b) in which only the coil 11 is excited. Also, FIGS. 2(c) and 2(d) detect the detection object W in the radial direction of the coil. When FIGS. 2(c) and 2(d) are compared, V1 in FIG. 2(c) is lower than that in FIG. 2(d) in which only the coil 11 is excited. That is, information on the bearing of the detection object W can be obtained by detecting a change in the received voltage when the excitation pattern is changed.

Although only the voltage V1 in the coil 11 has been described here, the accuracy of detecting the position of the detection object W can be improved by using the value of the voltage V2 in the coil 12 when the excitation pattern is changed. That is, if the positional relationship between the coils 11 and 12 is known, the position information of the detection object W can be obtained with high accuracy by applying weighting to the bearing and the position on the basis of a reception signal 1 (voltage V1) acquired from the coil 11 and a reception signal 2 (voltage V2) acquired from the coil 12 when the two coils (both of the coils 11 and 12) of the coil unit 10 are excited, and the reception signal 3 (voltage V1) acquired from the coil 11 and the reception signal 4 (voltage V2) acquired from the coil 12 when only one coil (coil 11) is excited.

Further, as a specific configuration of the proximity sensor, excitation of the coils 11 and 12 according to each pattern and acquisition of the reception signals may be performed at the same time or may be performed in a time-division manner. Further, one of the coils 11 and 12 may not be excited, reception signals of both of the coils 11 and 12 may be always acquired, or a time for acquiring the reception signals may be limited.

(3) First Modified Example (Coil Unit 10A) of Coil Unit 10 and Excitation Pattern FIGS. 3(a) to 3(c) are, as a first modified example of the coil unit 10, schematic cross-sectional views illustrating respective magnetic field in a case in which a coil unit 10A having three coils 11 to 13 is excited in three different patterns. Also, the left end of each figure corresponds to a position of a central axis X of the coils 11 to 13 (illustration of the central axis X itself is omitted in FIGS. 3(b) and 3(c)), and only the right half of the coils 11 to 13 are illustrated.

The number of coils of the coil unit 10 of the proximity sensor is not limited to two, and, for example, as illustrated in FIGS. 3(a) to 3(c), in addition to the coils 11 and 12, a circular coil 13 having a larger diameter disposed coaxially therewith may be provided.

Then, the voltages V1 to V3 of the coils 11 and 13 may be respectively obtained by forming excitation spaces with different patterns such as a case in which all of the coils 11 to 13 of the coil unit 10A are simultaneously excited (FIG. 3(a)), a case in which the two inner coils 11 and 12 are excited (FIG. 3 (b)), and a case in which only the coil 11 on an innermost side is excited (FIG. 3(c)). In this manner as well, the position information of the detection object W in which the bearing is weighted can be obtained.

Figure 4:
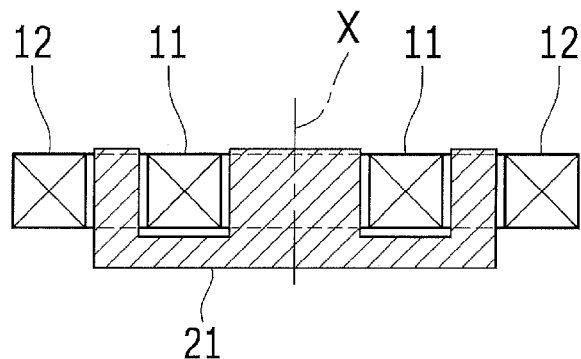
FIG. 4 is a schematic cross-sectional view illustrating a specific example of a core used for the coil unit 10.
Figure 5A:
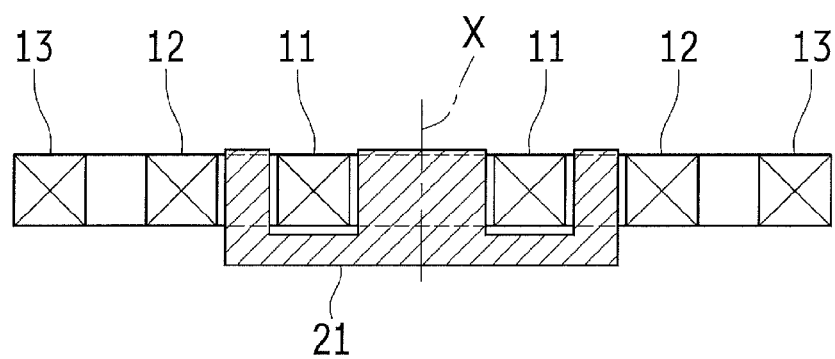
FIGS. 5(a) and 5(b) are schematic cross-sectional views respectively illustrating specific examples of cores used for a coil unit 10A.
Figure 5B:
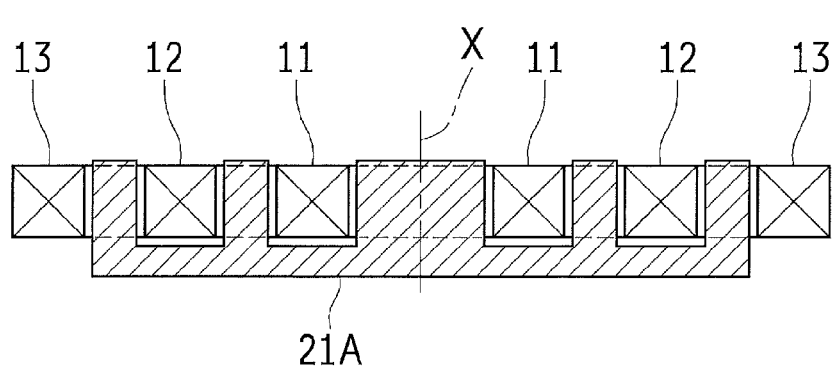
Figure 6A:
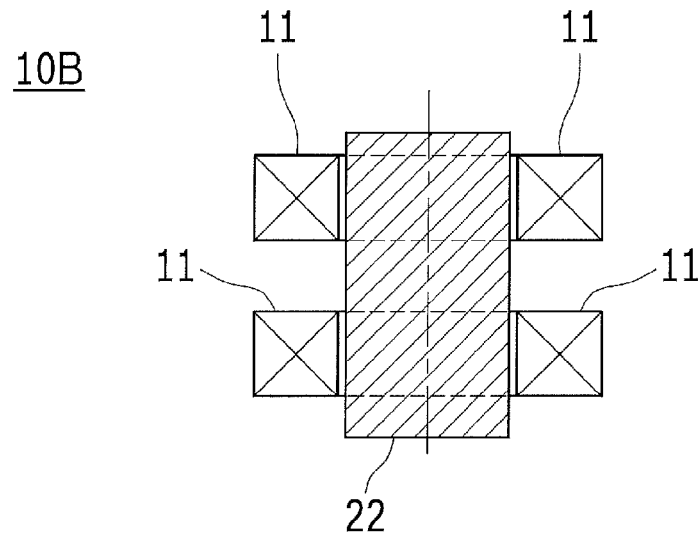
FIGS. 6(a) and 6(b) are schematic cross-sectional views respectively illustrating a coil unit 10B which is a second modified example of the coil unit 10 and a coil unit 10C which is a third modified example.
Figure 6B:
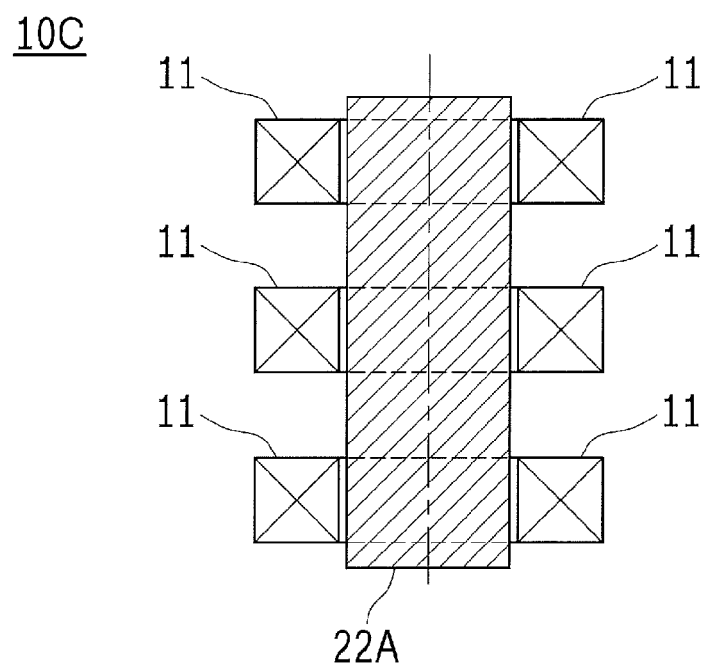

(4) Specific Examples of Coil Units 10 and 10A and Core, and Further Modified Example Thereof FIG. 4 is a schematic cross-sectional view illustrating a specific example of a core used for the coil unit 10. FIGS. 5(a) and 5(b) are schematic cross-sectional views respectively illustrating specific examples of cores used for the coil unit 10A. FIGS. 6(a) and 6(b) are schematic cross-sectional views respectively illustrating a coil unit 10B which is a second modified example of the coil unit 10 and a coil unit 10C which is a third modified example.

In the coil unit 10 having the coils 11 and 12, as illustrated in FIG. 4, a core 21 which is inside the coil 11 and between the coils 11 and 12 may be used.

Also, in the coil unit 10A having the coils 11 to 13, the core 21 as illustrated in FIG. 5(a) may be used, or a core 21A which is inside the coil 11, between the coils 11 and 12, and between the coils 12 and 13 as illustrated in FIG. 5(b) may be used.

As the second modified example of the coil unit 10, as illustrated in FIG. 6(a), a coil unit 10B in which two coils 11 are disposed in the central axis direction is also conceivable. In this case, a core 22 which is inside the two coils 11 may be used.

As the third modified example of the coil unit 10, as illustrated in FIG. 6(b), a coil unit 10C in which three coils 11 are disposed at regular intervals in the central axis direction is also conceivable. In this case, a core 22A which is inside the three coils 11 may be used.

(5) Specific Excitation Patterns of Coil Units 10 to 10C

Figure 7A:
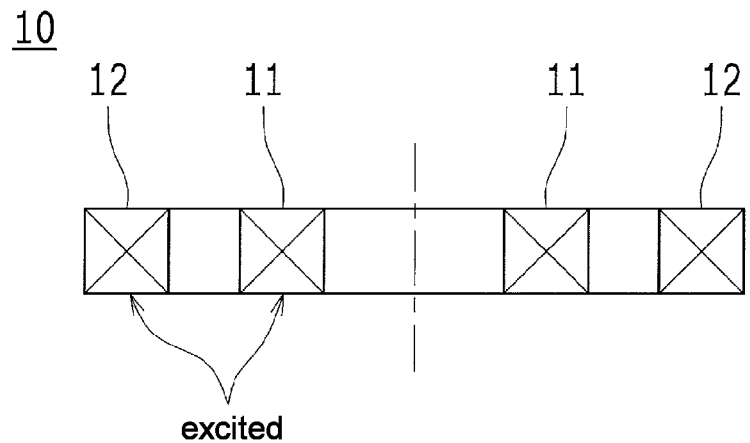
FIGS. 7(a) and 7(b) are schematic cross-sectional views respectively illustrating specific excitation patterns of the coil unit 10.
Figure 7B:
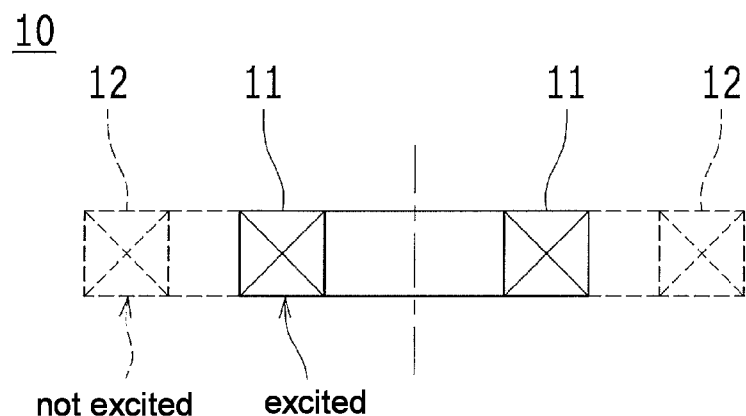
Figure 9A:
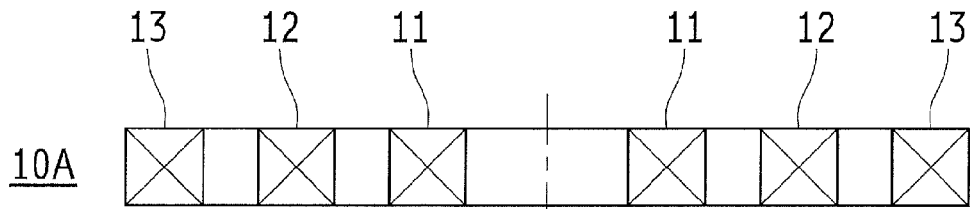
FIGS. 9(a) to 9(g) are schematic cross-sectional views respectively illustrating specific excitation patterns of the coil unit 10A.
Figure 9B:
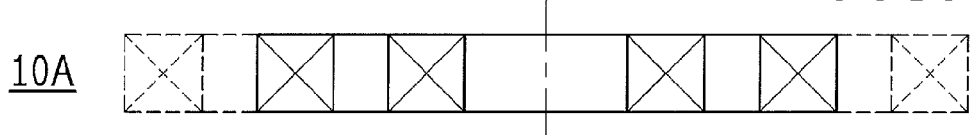
Figure 9C:
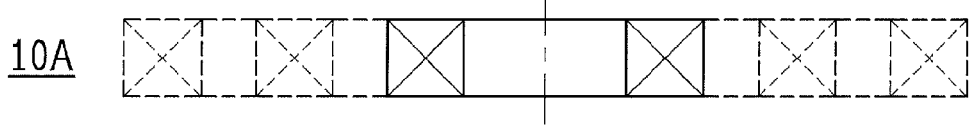
Figure 9D:
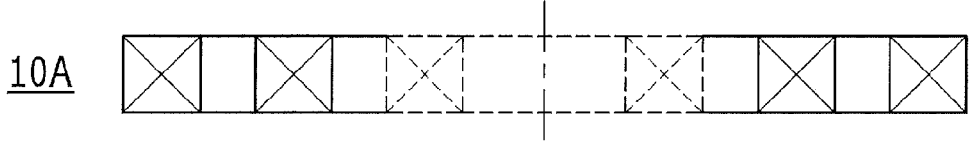
Figure 9E:
Figure 9F:
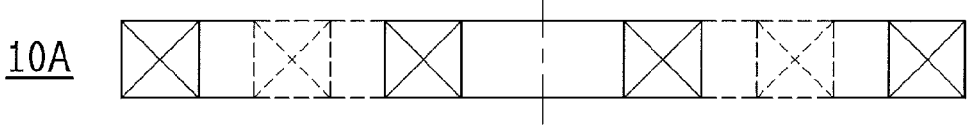
Figure 9G:
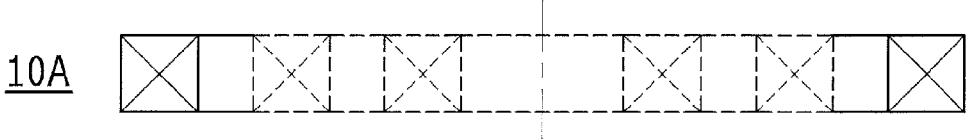
Figure 10A:
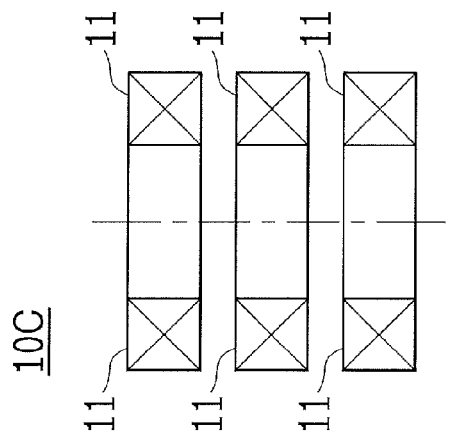
FIGS. 10(a) to 10(g) are schematic cross-sectional views respectively illustrating specific excitation patterns of the coil unit 10C.
Figure 10B:
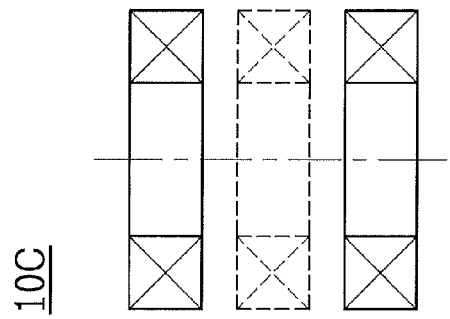
Figure 10C:
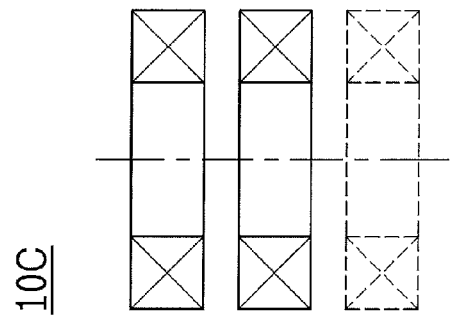
Figure 10D:
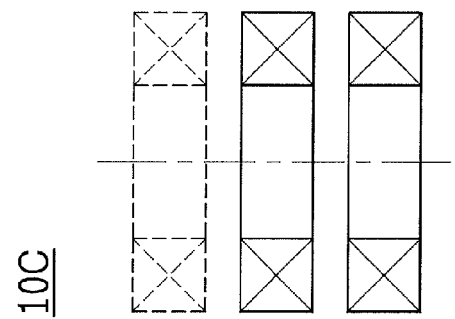
Figure 10E:
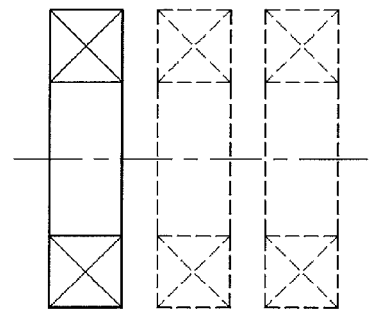
Figure 10F:
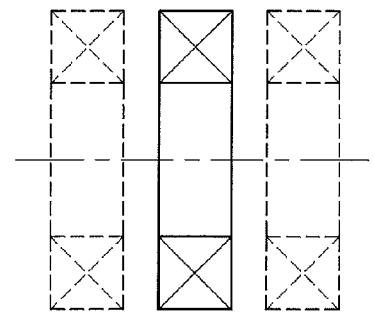
Figure 10G:
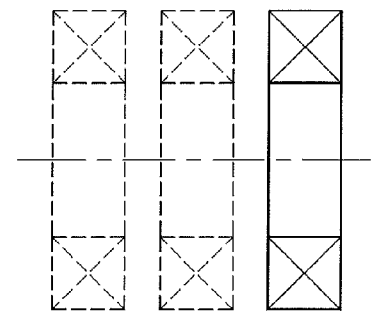

FIGS. 7(a) and 7(b) are schematic cross-sectional views respectively illustrating specific excitation patterns of the coil unit 10. FIGS. 8(a) to 8(c) are schematic cross-sectional views respectively illustrating specific excitation patterns of the coil unit 10B. FIGS. 9(a) to 9(g) are schematic cross-sectional views respectively illustrating specific excitation patterns of the coil unit 10A. FIGS. 10(a) to 10(g) are schematic cross-sectional views respectively illustrating specific excitation patterns of the coil unit 10C. In these figures, a solid line indicates an excited coil, and a broken line indicates a not excited coil.

As described already with reference to FIG. 2, as the specific excitation pattern of the coil unit 10, for example, a case in which both of the coils 11 and 12 are simultaneously excited (see FIG. 7(a)) and a case in which only the inner coil 11 is excited (see FIG. 7(b)) can be conceived, but there may also be a pattern in which only the outer coil 12 is excited.

As the specific excitation pattern of the coil unit 10B, three patterns illustrated in FIGS. 8(a) to 8(c) are conceivable.

As the specific excitation pattern of the coil unit 10A, for example, seven patterns illustrated in FIGS. 9(a) to 9(g) are conceivable.

As the specific excitation pattern of the coil unit 10C, seven patterns illustrated in FIGS. 10(a) to 10(g) are conceivable.

(6) Schematic Configuration of Reception-Related Portion of Proximity Sensor

Figure 11:
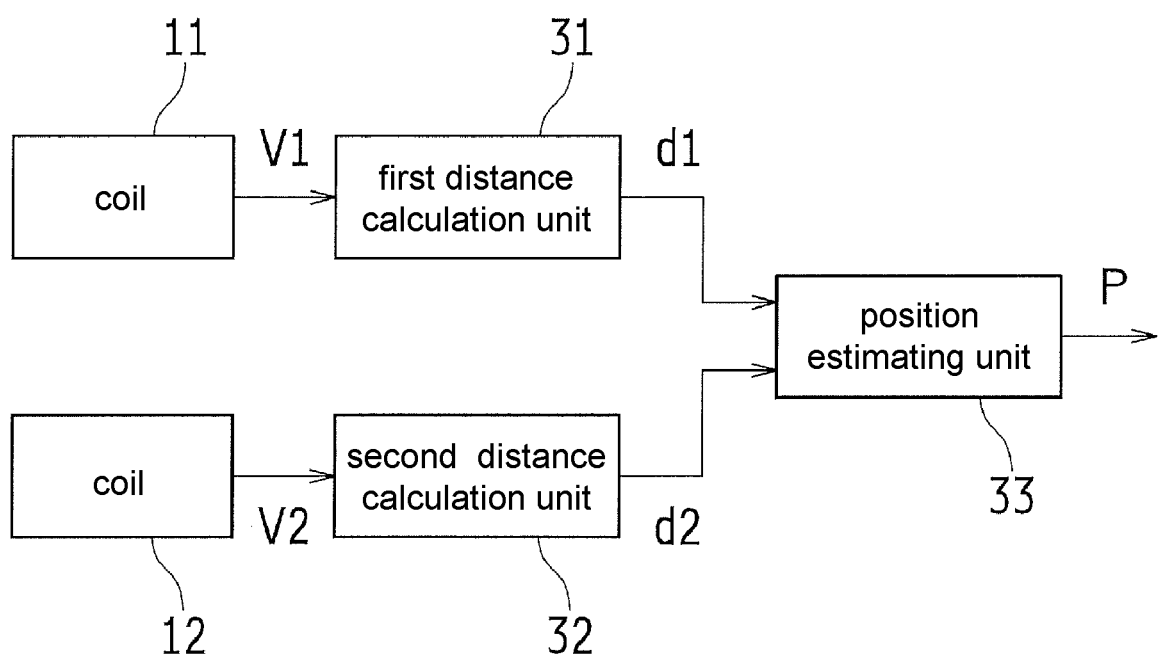
FIG. 11 is a block diagram illustrating a schematic configuration of a reception-related portion of the proximity sensor having the coil unit 10.

FIG. 11 is a block diagram illustrating a schematic configuration of a reception-related portion of the proximity sensor having the coil unit 10.

As shown in FIG. 11, the proximity sensor, as the reception-related portion, includes coils 11 and 12 disposed in a predetermined positional relationship, a first distance calculation unit 31 for calculating first distance information d1 for the detection object W from the voltage V1 of the coil 11, a second distance calculation unit 32 for calculating second distance information d2 for the detection object W from the voltage V2 of the coil 12, and a position estimating unit 33 for estimating the position P (distance and bearing) of the detection object W on the basis of the positional relationship between the coils 11 and 12, the first distance information d1, and the second distance information d2.

Besides these, the proximity sensor also includes an excitation circuit for selectively exciting the coils 11 and 12, and the like. With this excitation circuit, the coils 11 and 12 are excited in different patterns.

Also, the first distance calculation unit 31 and the second distance calculation unit 32 do not necessarily need to be independent, and one distance calculation unit may calculate both the first distance information d1 and the second distance information d2. Such a distance calculation unit and the position estimating unit 33 may be combined into one. The positional relationship between the coils 11 and 12 may be stored in advance in the position estimating unit 33.

Although the position P of the detection object W estimated by the position estimating unit 33 refers to the distance and the bearing to the detection object W, as described with reference to FIG. 1, however, the position in the three-dimensional space may not necessarily be able to be identified. In practice, it can only be assumed that it is on a circumference which is coaxial with the coils 11, 12.

The present invention can be embodied in various other forms without departing from its spirit or essential features. Therefore, each embodiment and each example described above are merely illustrative in all respects and should not be construed restrictively. The scope of the present invention is indicated by the scope of the claims and is not bound in any way by the text of the specification. Moreover, all variations and modifications belonging to the equivalent scope of the claims are within the scope of the present invention.

Priority is claimed on Japanese Patent Application No. 2016-008365, filed Jan. 20, 2016, the contents of which are incorporated into the present application by reference. In addition, references cited herein are specifically incorporated by reference in their entirety.

The invention claimed is:

1. A proximity sensor comprising:
   two or more coils disposed in a predetermined positional relationship;
   a distance calculation unit which calculates respective pieces of distance information from the coils which obtain a reception result to a detection object on the basis of the reception results of a plurality of coils from among the coils; and
   a position estimating unit which estimates a position of the detection object on the basis of each piece of distance information and the positional relationship, wherein:
   each of the coils is selectively excited in two or more different combinations,
   the distance calculation unit calculates respective pieces of distance information from the plurality of coils to the detection object for each selective excitation of each of the coils, and
   the position estimating unit estimates the position of the detection object on the basis of the positional relationship and each piece of distance information calculated for each of the selective excitation.

2. The proximity sensor according to claim 1, wherein each of the coils is coaxially disposed.

3. The proximity sensor according to claim 1, wherein each of the coils is disposed on the same plane.

4. The proximity sensor according to claim 2, wherein each of the coils is disposed on the same plane.

* * * * *